United States Patent [19]

Engdahl et al.

[11] 4,104,553

[45] Aug. 1, 1978

[54] FASTENING AND SUSPENSION ELEMENT FOR A PIEZOELECTRIC RESONATOR

[75] Inventors: Jean Engdahl, Bienne; Huber Matthey, Brugg, both of Switzerland

[73] Assignee: Societe Suisse pour l'Industrie Horlogere (SSIH) Management Services S.A., Bienne, Switzerland

[21] Appl. No.: 561,309

[22] Filed: Mar. 24, 1975

[30] Foreign Application Priority Data

Mar. 29, 1974 [CH] Switzerland ............... 4401/74

[51] Int. Cl.² ........................................ H01L 41/10
[52] U.S. Cl. .......................................... 310/352
[58] Field of Search ................... 310/9.1, 9.4, 8.2

[56] References Cited

U.S. PATENT DOCUMENTS

| 2,343,738 | 3/1944 | Bechmann et al. | 310/9.4 X |
| 2,371,613 | 3/1945 | Fair | 310/8.2 |
| 2,441,139 | 5/1948 | Fair | 310/9.4 X |
| 2,546,321 | 3/1951 | Ruggles | 310/9.4 |
| 2,660,680 | 11/1953 | Koerner | 310/9.4 X |
| 3,735,166 | 5/1973 | Bradley | 310/9.4 |
| 3,863,315 | 2/1975 | Jenni | 310/9.4 X |

FOREIGN PATENT DOCUMENTS

| 43-24576 | 5/1964 | Japan | 310/9.4 |
| 1,050,412 | 12/1966 | United Kingdom | 310/9.1 |

Primary Examiner—Mark O. Budd
Attorney, Agent, or Firm—Griffin, Branigan and Butler

[57] ABSTRACT

A suspension element for fastening a piezoelectric resonator to a support isolates mechanical vibrations tending to be transmitted between the support and the resonator. The element has a thin active area with thicker ends for coupling and damping.

5 Claims, 6 Drawing Figures

FASTENING AND SUSPENSION ELEMENT FOR A PIEZOELECTRIC RESONATOR

The present invention relates to a fastening and suspension element for a piezoelectric resonator and in particular for a so-called low frequency resonator, i.e. one which vibrates in the bending mode, torsion mode, longitudinal mode or surface shear mode. Such type of resonator finds application in numerous domains such as telemetering systems, telecommunication by telephone or wireless, oscillators, filters, frequency standards, etc.

Resonators of this type are generally suspended at their nodal points, or where perfect nodes are lacking, at their zones exhibiting the least amplitude, by metal wires in the form of nails. The latter are attached by their heads to the surface of the resonator by welding onto a drop of sintered conductive glass, direct welding onto the metallications forming the electrodes, heat compression or any other appropriate process. The other end of the wire is united with the mounts by soft soldering or electric welding.

For best results it is necessary that no resonator vibration be transmitted outside of the enclosure and that no external disturbance be transmitted to the resonator. Such in either case, from the vibratory situation of the resonator will produce a reaction from the elements to which said resonator is mechanically or electrically coupled. Such coupling will bring about either distortions in the resonance frequency or a lowering of the quality factor and most often both of these undesired effects simultaneously. In transmitting vibrations the resonator suspension plays a particularly important role.

Since the nodal points are never perfect they are always affected by vibration no matter how small the amplitude thereof and the suspension wires will therefore also be affected. There exists however the possibility of employing such wires as insulators in respect of the mechanical energy of vibration. The free length $l_i$ must then satisfy the relationship:

$$l_i = k(2n-1)\lambda/4 \ (n = 1, 2, 3 ..),$$

in which $\lambda$ represents the wave length for the type of vibration considered and depends from the geometry of the wire and the physical characteristics of the metal from which it is made, $k$ being a natural integer which depends from the nature of the embedding of the wire and also from $n$.

When a length of wire does not conform to the above-mentioned condition it has been known to use a so-called "balling" method. This consists in depositing onto the wire a small calibrated ball of metal generally formed from soft solder at a distance $l_i$ from the resonator and obeying the above relationship.

This last method however is somewhat difficult of execution and may leave much to be desired in respect of its precision, particularly when the wave length $\lambda$ becomes small relative to the dimensions of the wire and the welds.

To overcome this difficulty it has been proposed to insert in the propagation path of the undesired vibrations devices to absorb the energy of such vibrations through converting said energy into heat through internal friction, note for example Swiss Pat. No. 392,638. This solution at best is makeshift since from the energy viewpoint it results in very low efficiency and hence a low quality factor.

It has also been proposed to provide the suspension wires with particular forms of cross-sections and to bend such suspension wires, see Swiss Pat. No. 499,819. This solution is limited to resonators operating in the bending mode and the wires used for each case have their form adapted to the particular resonator to be used.

Such difficulties are sought to be avoided by the present invention for which the purpose is to provide a suspension for piezoelectric resonators having well determined natural frequencies practically independent from the method of fastening to the support usable even for very small free lengths and for a given support in a large range of frequencies vibration modes and resonator dimensions.

Such purpose is proposed to be obtained by providing the suspension element at each of its extremities with a zone having a cross-section substantially larger than that of the active zone, the distance separating these extremity zones defining the active length of the element. These two zones comprise expansions which are designed respectively to be fixed to the resonator and to the support. The element is preferably obtained from a single plane sheet with the changes of section or expansions resulting from a simple increase of width relative to the active length. The expansion at the support end is provided with a notch in which the support may be accomodated. In a particular form of execution the zone defining the active length is elbowed and may carry an intermediate expansion capable of receiving an auxiliary mass.

For a better understanding of the following description reference is made to the drawings among which FIG. 1 shows a form of a fastening and supporting element in accordance with the invention FIG. 2 shows in portions (a), (b) and (c) how an element as shown in FIG. 1 lends itself to resonators of various dimensions.

Figure 1:
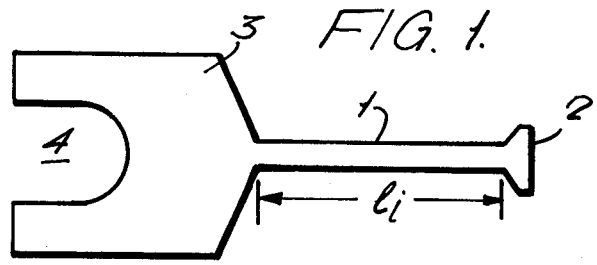

The fastening and support element according to this invention as shown in FIG. 1 appears in the form of a single piece cut out of a metallic sheet and comprises the following parts: a wire 1 which may oscillate, at one extremity of the wire 1 a fastening expansion 2 and at the other end an insulating expansion 3 provided with a notch 4 for fastening to a support.

The free length $l_i$ of the element is the length of wire 1 limited by the two expansions 2 and 3. In practice such an element will function satisfactorily in a range of frequency for which the associated wave length is $\lambda$ in a manner such that the free length $l_i$ will be within limits defined by $k(2n-1)\lambda/4 - \lambda/8$ and $k(2n-1)\lambda/4 + \lambda/8$. The expansions 2 and 3 are given a form such that at the time of fastening through welding or soldering to the resonator or to the support the surface tension of the molten solder will prevent propagation thereof along the wire portion 1.

Figure 2:
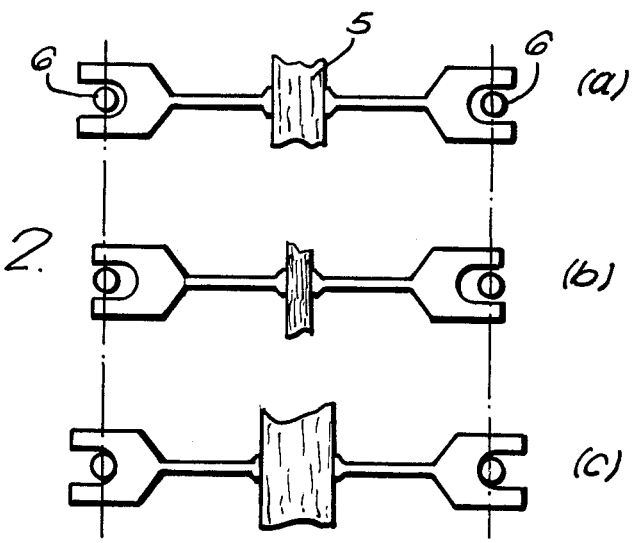

The form of notch 4 enables a pair of elements as illustrated for example in (a), (b) and (c) of FIG. 2 to accomodate various thicknesses of resonator 5 without the necessity of modifying the distance supporting the mountings 6 from a support (not shown).

Figure 3:
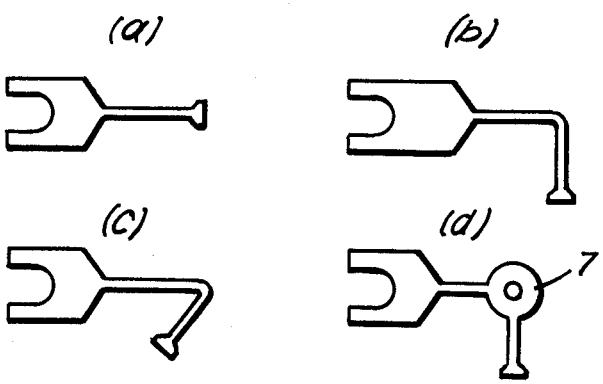
FIG. 3 shows in portions (a), (b), (c) and (d) variant forms which the invention may take.

According to the desired application and proceeding from the same basic principle various forms of the invention are possible. Certain among them are particularly well adapted to certain vibration modes and are shown in FIG. 3. The basic form as shown in (a), as described above, is well adapted to longitudinal and shear modes of vibration. Elbowed forms (b) and (c) are preferred for bending modes. The form (d) offers an additional advantage in providing the possibility to isolate undesirable modes by a technique related to "balling": a pallet 7 integral with the assembly and formed from a single piece together with the remainder provides a central hole wherein it is possible to melt and retain a predetermined mass of solder by capillarity.

Figure 4:
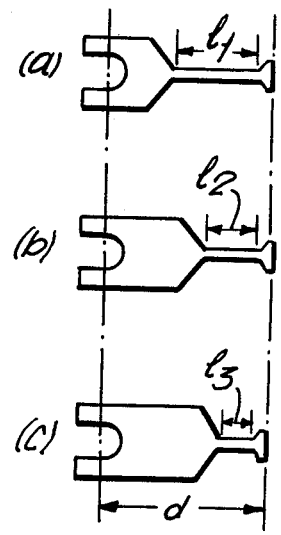
FIG. 4 shows how with the same overall length of the element the free length may be altered.

From the given distance d as determined from a given support the free length $l_i$ may be varied through simple change in the dimensions of the expansion used for fastening to the support as shown in (a), (b) and (c) of FIG. 4. By a careful choice of a set of free lengthes $l_1$, $l_2$, $l_3$, etc. as well as through the choice of metal sheets of various thicknesses it is reasonably easy with a minimum of different elements to provide for the entire range of usual frequencies and vibration modes.

Figure 5:
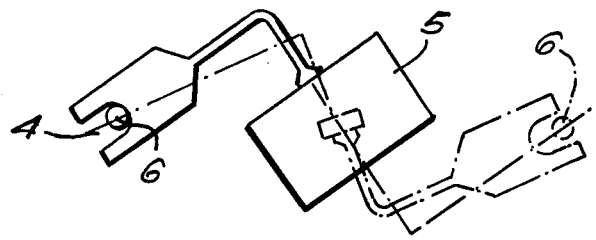
FIG. 5 shows how with one form of execution resonators of approximate square cross-sections but of widely varying sizes may be accomodated.

FIG. 5 shows a particularly useful form of elbowed elements such as those of FIG. 3 and associated with resonators of approximately square form as often used in the bending mode. It will be seen that these elements lend themselves without difficulty to substantial variations in the cross section of the resonator 5 (a single element is shown for two different cases of which one is shown in dotted outlines). Here it is unnecessary to modify the distance separating mountings 6 from the support. A pivoting of the assembly and an adjustment of the depth of welding of the notch 4 are sufficient.

Figure 6:
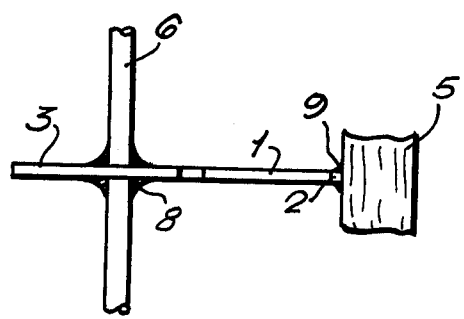
FIG. 6 shows the manner in which the element of this invention is fastened to the resonator and to the support.

On FIG. 6 is illustrated the manner in which the weld metal 8 may be deposited between the expansion 3 and the mounting 6 for the support on one hand and the weld metal 9 between the expansion 2 and resonator 5 on the other hand. Thus may be realized an excellent embedding leading to elimination of all stress or undesirable friction.

As has been already mentioned above the elements forming the object of the invention are simply cut out of a leaf or sheet of metal of suitable thickness. Such cutting may be made through punching, chemical engraving or any other appropriate process, chemical engraving being however more flexible and cheaper where one seeks to obtain special forms. In certain cases it appears moreover useful to diminish the cross section of wire 1 by punching, forging or any other like treatment.

What we claim is:

1. A suspension element for fastening a piezoelectric resonator to a support while isolating mechanical vibrations tending to be transmitted between the support and the resonator, said suspension element comprising a body having an active zone portion bounded on the ends thereof by two zone portions said two zone portions having cross sections substantially greater than that of said active zone portion, said active zone portion and said two end zone portions being formed from a single planar piece of material the cross sectional changes of which result entirely from changes of width, the distance separating said zone portions of greater cross section defining the free length of the element, said zone portions of greater cross section comprising two expansions for dampening said vibrations and for fastening the element to the resonator and to the support, respectively.

2. A suspension element as claimed in claim 1 wherein said active zone portion has a length $l_1$, where:

$$l_1 = k(2n-1)\lambda/4,$$

$\lambda$ being the wave length of the vibrations being damped, and k and n being integers.

3. A suspension element as claimed in claim 1 wherein the expansion provided at the support end is provided with a notch adapted to receive the support.

4. A suspension element as claimed in claim 1 wherein the active zone defining the free length is elbowed and wherein the elbow includes an intermediate expansion with a hole therein for receiving and retaining an auxiliary mass.

5. A suspension element as claimed in claim 3 wherein the active zone defining the free length is elbowed and wherein the elbow includes an intermediate expansion with a hole therein for receiving and retaining an auxiliary mass.

* * * * *